United States Patent
Ma et al.

(10) Patent No.: US 8,319,586 B2
(45) Date of Patent: Nov. 27, 2012

(54) INTEGRATED CIRCUIT

(75) Inventors: Yugang Ma, Singapore Science Park II (SG); Xiaobing Sun, Singapore Science Park II (SG)

(73) Assignee: Sony Corporation, Tokyo (JP)

( * ) Notice: Subject to any disclaimer, the term of this patent is extended or adjusted under 35 U.S.C. 154(b) by 263 days.

(21) Appl. No.: 12/868,297

(22) Filed: Aug. 25, 2010

(65) Prior Publication Data

US 2011/0050369 A1 Mar. 3, 2011

(30) Foreign Application Priority Data

Sep. 2, 2009 (SG) ................. 200905866-0

(51) Int. Cl.
*H01L 23/66* (2006.01)
*H03H 7/38* (2006.01)
(52) U.S. Cl. .......................... 333/260; 333/32
(58) Field of Classification Search .............. 333/32, 333/33, 260, 238, 246, 254
See application file for complete search history.

(56) References Cited

U.S. PATENT DOCUMENTS 4,686,492 A 8/1987 Grellmann et al.
8,102,665 B2 * 1/2012 Rofougaran ............... 361/764
2008/0136552 A1 6/2008 Kim et al.

FOREIGN PATENT DOCUMENTS

EP 1 041 632 A1 10/2001

OTHER PUBLICATIONS

Fikar et al.; Bandwidth Material Chip to PCB Using Bond Wires for Broadband Matching; 12th Workshop on Singal Propagation on Interconnects, & SPI2008 Program, May 15, 2008 Poster Session I.
Lim et al.; RF Characterization and Modeling of Various Wire Bond Transitions; IEEE Transaction on Advanced Packaging; vol. 28, No. 4; Nov. 2005.
Examination Report dated Oct. 24, 2011 in connection with counterpart Singapore Application No. SG 200905866-0.

* cited by examiner

*Primary Examiner* — Stephen Jones
(74) *Attorney, Agent, or Firm* — SNR Denton US LLP

(57) ABSTRACT

An integrated circuit comprising: a substrate; a first transmission line arranged on the substrate, the first transmission line having a first termination; a die having a first surface on the substrate and an opposed second surface, the die being spaced from the first termination; a second transmission line arranged on the second surface of the die, the second transmission line having a second termination; and a bond wire connected between the first termination and the second termination configured to have a length half the wavelength of the signal central frequency.

10 Claims, 3 Drawing Sheets

(a) Over-air case     (b) in high dielectric constant material case ized space, the impedance in CPW traces on IC die and PCB may be different.

INTEGRATED CIRCUIT

CROSS REFERENCE TO RELATED APPLICATIONS

The present application contains subject matter related to that disclosed in Singapore Priority Patent Application 200905866-0 filed in the Singapore Patent Office on Sep. 2, 2009, the entire content of which is hereby incorporated by reference.

FIELD OF THE INVENTION

The present invention relates to an integrated circuit, particularly though not solely, to a wire bond connection between components in a high frequency integrated circuit.

BACKGROUND

Bonding wire is a widely used connection approach between an IC die and a substrate or PCB. Bond wires are very simple, convenient and low cost. However, it is usually considered as a low frequency approach. In a high frequency IC, such as 60 GHz millimeter frequency band, typically ribbon bonding or flip-chip bonding is used because those connections have lower inductance and better high frequency performance. However, this may be more expensive. Moreover, ribbon bonding may occupy more space on IC die. Also flip-chip connection may cause a routing difficulty between the IC die and PCB substrate (or interposer).

For example in U.S. Pat. No. 4,686,492 multiple bond wires are used to improve the die to PCB impedance matching. However, many bond wires are used for single signal connection. Thus this solution is not simple, low cost or small in footprint.

SUMMARY OF THE INVENTION

In general terms the present invention proposes a bond wire connection which is $\lambda/2$, where $\lambda$ is the wavelength of the signal central frequency. There may also be a quarter wavelength transformer on the substrate which is dimensioned according to the spanning angle of the bond wire. This may have the advantage that it
1. is a simple and cheap solution using just bond-wire,
2. can achieve more than 20 GHz signal bandwidth in 60 GHz millimeter frequency band, and/or
3. can be used in "over-air" case and in mold resin case.

In a first particular expression of the invention there is provided an integrated circuit as claimed in claim 1.

Embodiments of the invention may be implemented as claimed in claims 2 to 10.

BRIEF DESCRIPTION OF THE DRAWINGS

One or more example embodiments of the invention will now be described, with reference to the following figures, in which.

DETAILED DESCRIPTION

Figure 1:
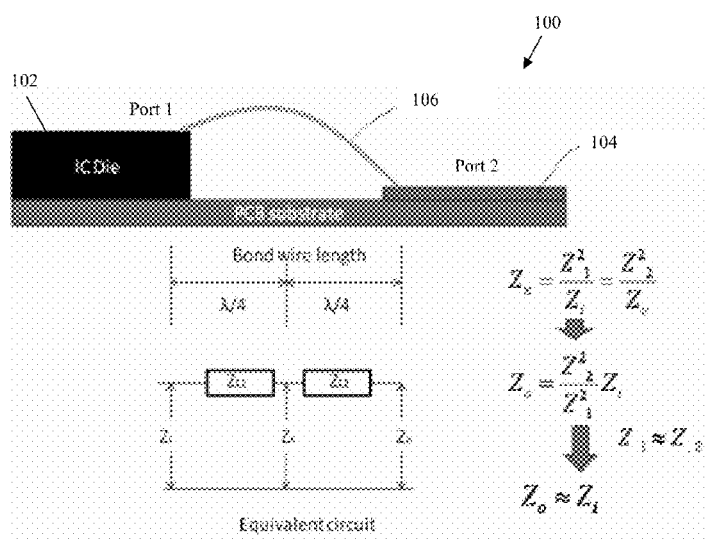
FIG. 1. is a schematic drawing of the transmission line according to an example embodiment, FIG. 2. is the illustration of the IC die-to-PCB coupler of CPW version, FIG. 3. is the S-parameters for the embodiment in FIG. 2, FIG. 4. is the illustration of the IC die-to-PCB coupler with high dielectric constant material around the bonding wire, FIG. 5. is a graph of the S-parameters for the circuit embodiment in FIG. 4, and FIG. 6. is a photograph of a prototype of an example embodiment.

FIG. 1 shows an integrated circuit 100 including a die 102 connected to a PCB substrate (or its interposer coupler) 104 using a bond wire 106. The bond wire 106 is designed based on the quarter wavelength transformer theory. The input impedance for port 1 on the die 102 is $Z_i$, the wavelength of the signal central frequency is $\lambda$ and the characteristic impedance of the bond wire 106 is $Z_L$, then after $\lambda/4$ of the transmission line, the output impedance will be $$Z_o = \frac{Z_L^2}{Z_i} \quad (1)$$

Symmetrically, $$Z_i = \frac{Z_L^2}{Z_o} \quad (2)$$

The input impedance at port 1 is usually low, commonly 50 ohm or 75 ohm (corresponding to the characteristic impedance of the transmission line on the die 102). Since the wire is very thin, the transmission line built by bond wire has very high impedance. If port 1 on die or PCB is directly connected to bond wire, the impedance between the port and bond wire is mismatched, and the signal cannot pass through bond wire part well. If the impedance of the bond wire part can be accurately calculated, the problem may be solved by adding a quarter-wavelength transformer on PCB. Unfortunately, it may be difficult to calculate the bonding wire's impedance accurately.

The length of the bond wire 106 is chosen to provide two back-to-back quarter wavelength transformers just using the bond-wire, i.e the total length is $\lambda/2$. No matter what the bond-wire' characteristic impedance is, after two quarter-wavelength transformers the output impedance (port 2) is close to the input impedance, because the characteristic parameters of bond wire part 1 (first quarter wavelength) is approximately equal to that of part 2 (the second quarter wavelength) because of similar structure. The first part (the $1^{st}$ quarter-wavelength) 108 has the characteristic impedance of $Z_1$ and the second part ($2^{nd}$ quarter wavelength) 110 has the characteristic impedance of $Z_2$. Then at the central point the impedance $Z_x$ is calculated in Equation 3:

$$Z_x = \frac{Z_1^2}{Z_i} = \frac{Z_2^2}{Z_o} \quad (3)$$

and the output impedance $Z_o$ is calculated in Equations 4 to 6:

$$Z_o = \left(\frac{Z_2}{Z_1}\right)^2 Z_i \quad (4)$$

$$Z_1 \approx Z_2 \quad (5)$$

$$Z_o \approx Z_i \quad (6)$$

Note that, we may not need to know the exactly value of $Z_1 Z_1$ and $Z_2$. We may need to know the ratio of them, so that the output impedance may be calculated.

Figure 2:
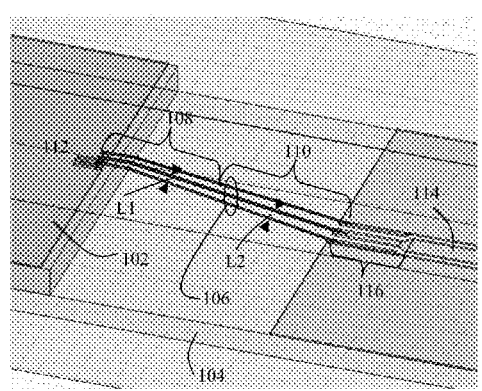

Since the CPW traces 112,114 on IC die and PCB have different sizes due to different dielectric constants and limitation of fabrication processing. The distances between wires may gradually increase from IC die 102 to PCB 104 as shown in FIG. 2. The average distance of the first quarter-wavelength part of bonding wire transmission line (from IC die side) 108 is $L_1$ and the second quarter-wavelength part of bonding wire transmission line 110 is $L_2$, the characteristic impedance ratio R of the second and first quarter wavelength bond wire transmission lines can be calculated in Equation 7:

$$R = \frac{\frac{1}{\pi}\sqrt{\frac{\mu}{\varepsilon}}\left(\cosh\frac{L_2}{d}\right)^{-1}}{\frac{1}{\pi}\sqrt{\frac{\mu}{\varepsilon}}\left(\cosh\frac{L_1}{d}\right)^{-1}} = \frac{\left(\cosh\frac{L_2}{d}\right)^{-2}}{\left(\cosh\frac{L_1}{d}\right)^{-1}} \qquad (7)$$

where, d is the diameter of the bond-wire. ∈ is the relative dielectric constant and μ is the relative permeability of the material around the bond wires. The relationship in Equation 7 between $L_1$, $L_2$ and R may be termed the spanning angle and the length of the bond wire length. The output impedance $Z_o$ may be recalculated according to Equation 8:

$$Z_o = \left(\frac{Z_2}{Z_1}\right)^2 Z_i Z_o = \left(\frac{Z_2}{Z_1}\right)^2 Z_i = R^2 Z_i \qquad (8)$$

This transformer based coupler may be suitable for any kind of transmission line. As an example, FIG. 2 shows a coplanar waveguide (CPW) version. In CPW version, according to the spanning angles of bond wires, we can calculate the characteristic impedance ratio of two quarter-wavelength bond-wire transmission lines.

If we require that the output impedance of CPW on PCB is the same as the input impedance on IC die, a quarter-wavelength transformer (the $3^{rd}$ one) on PCB may be needed. The $3^{rd}$ quarter-transformer 116 may be attached between the PCB CPW 114 and the bond wire 106. If the output impedance on PCB CPW 114 is equal to the input impedance on the IC die CPW 112, the characteristic impedance $Z_3$ of the $3^{rd}$ transformer 116 can be calculated in Equation 9:

$$Z_o^1 = \frac{Z_3^2}{Z_o} \qquad (9)$$

$$Z_o^1 = Z_1 = \frac{Z_3^2}{Z_o} = \frac{Z_3^2}{(R^2 Z_i)}$$

$$Z_3 = R Z_i$$

Thus the spanning angle is used to design the dimensions and thus the characteristic impedance of the transformer 116.

Figure 3:
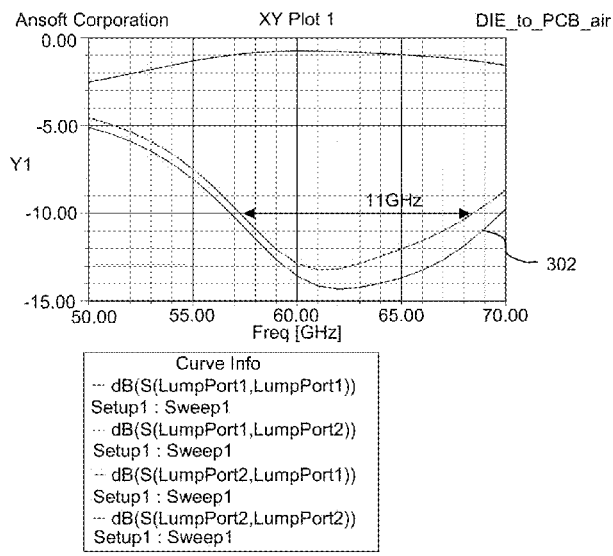

FIG. 3 shows the S-parameters of the CPW IC-to-PCB coupler 100. We can see the S11 and S22 matching impedance 302 is over than 10 GHz (passing through bandwidth).

Figure 4:
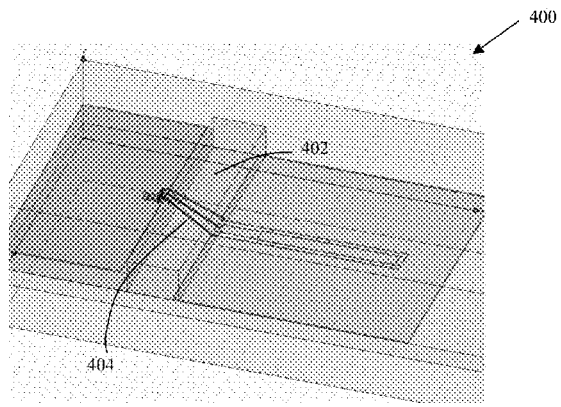

If we need wider bandwidth, we can reduce the bond wire transmission line's characteristic impedance. This can be done by shortening the distance between bond wires or increase the relative dielectric constant of the material around the bond wire, so that the characteristic impedance of the bond wire transmission line is closer to that on the IC die and PCB. FIG. 4 shows the DIE-to-PCB coupler 400 with high dielectric constant (∈=7.02) material 402 encapsulating the bond wire 404. Of course the absolute length of the bond wires 404 has to be reduced for the totally half wavelength requirement due to the high dielectric constant material 402 surrounding the bonding wires 404.

Figure 5:
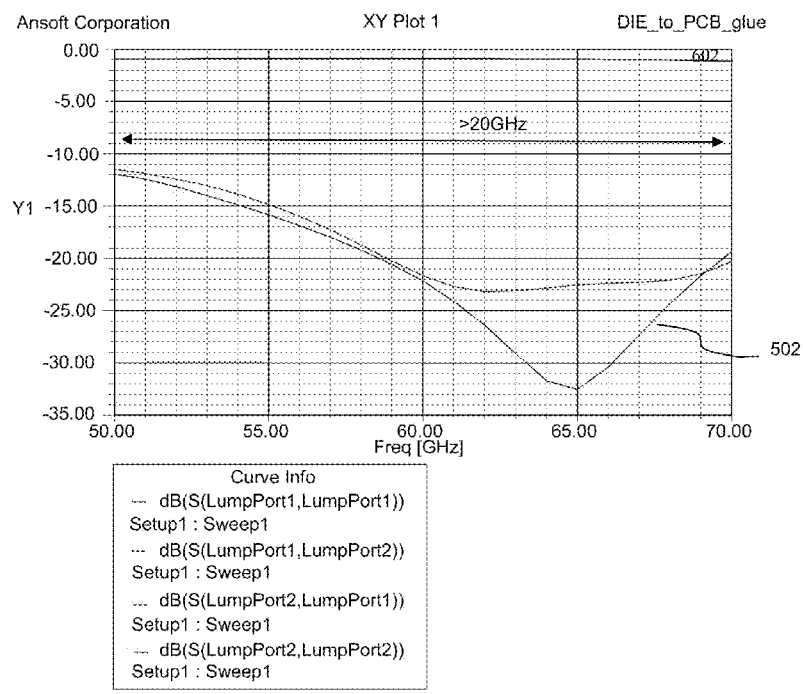

FIG. 5 shows the s-parameter results for the encapsulated coupler 400. We can see that the passing through bandwidth 502 is increased to over 20 GHz.

Figure 6:
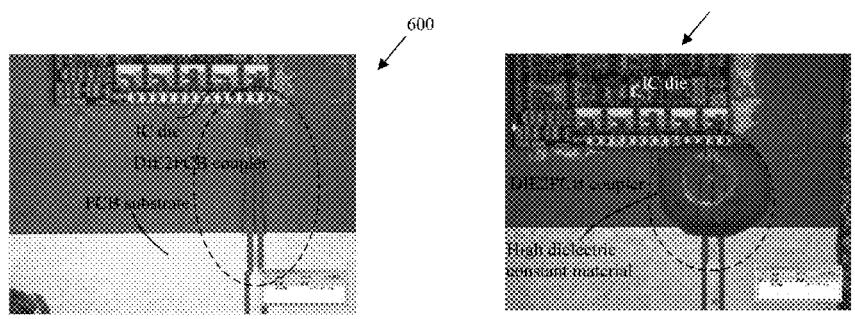

FIG. 6(a) shows a picture of a prototype DIE-to-PCB coupler 600 in over-air case. The media around the bond-wires 602 is air 604. The diameter of the bond wire 602 is 25 um and the total length of the bond wire 602 is 2.5 mm. The gap between two bond-wires 602,606 at the IC die side 608 is 100 um and the gap between two bond-wires 602,606 at the PCB substrate side 610 is 180 um.

FIG. 6(b) shows a picture of a prototype DIE-to-PCB coupler 612 with a high dielectric constant material. The media around the bond wires 614 is mold resin material 616 which has dielectric constant of 7.07 and loss tangent of 0.02. The diameter of the bond wire 614 is 25 um and the total length of the bond wire 614 is 1 mm. The gap between two bond wires 614,618 at the IC die side 620 is 100 um and the gap between two bond wires 614,616 at the PCB substrate side 622 is 350 um.

While example embodiments of the invention have been described in detail, many variations are possible within the scope of the invention as will be clear to a skilled reader.

The invention claimed is:

1. An integrated circuit comprising:
   a substrate;
   a first transmission line arranged on the substrate, the first transmission line having a first termination;
   a die having a first surface on the substrate and an opposed second surface, the die being spaced from the first termination;
   a second transmission line arranged on the second surface of the die, the second transmission line having a second termination; and
   a bond wire connected between the first termination and the second termination configured to have a length half the wavelength of the signal central frequency.

2. The integrated circuit of claim 1 further comprising a dielectric layer encapsulating the bond wire.

3. The integrated circuit of claim 1 wherein the first transmission line is a coplanar waveguide.

4. The integrated circuit of claim 1 wherein the second transmission line is a coplanar waveguide.

5. The integrated circuit of claim 1 wherein the second transmission line is selected from the group consisting of a slot line, strip line, twisted-pair and a microstrip line.

6. The integrated circuit of claim 1 further comprising two further bond wires spaced either side of the bond wire, wherein the two further bond wires are connected to a ground plane.

7. The integrated circuit of claim 6 wherein the two further bond wires can a constant spanning angle with respect to the bond wire.

8. The integrated circuit of claim 1 further comprising a quarter wavelength transformer on the substrate connected between the first termination and the bond wire.

9. The integrated circuit of claim 8 wherein the quarter wavelength transformer is configured to provided an impedance based on the spanning angle of is spanning angle is determined according to the impedance of the first transmission line and the impedance of the second transmission line.

10. The integrated circuit of claim 8 wherein the quarter wavelength transformer is configured to provide an impedance determined according to equation 9.

* * * * *